US009105361B2

United States Patent
Kim et al.

(10) Patent No.: US 9,105,361 B2
(45) Date of Patent: Aug. 11, 2015

(54) FAULT TOLERANT CONTROL LINE CONFIGURATION

(71) Applicant: Seagate Technology LLC, Cupertino, CA (US)

(72) Inventors: YoungPil Kim, Eden Prairie, MN (US); Rodney Virgil Bowman, Bloomington, MN (US)

(73) Assignee: Seagate Technology LLC, Cupertino, CA (US)

( * ) Notice: Subject to any disclaimer, the term of this patent is extended or adjusted under 35 U.S.C. 154(b) by 259 days.

(21) Appl. No.: 13/665,443

(22) Filed: Oct. 31, 2012

(65) Prior Publication Data

US 2014/0119123 A1 May 1, 2014

(51) Int. Cl.
*G11C 29/00* (2006.01)
*G11C 16/04* (2006.01)
*G11C 5/06* (2006.01)
*G11C 8/08* (2006.01)
*G11C 8/14* (2006.01)

(52) U.S. Cl.
CPC ............. *G11C 29/702* (2013.01); *G11C 5/063* (2013.01); *G11C 8/08* (2013.01); *G11C 8/14* (2013.01); *G11C 16/0483* (2013.01); *G11C 29/804* (2013.01)

(58) Field of Classification Search
CPC ........... G11C 11/4125; G11C 16/0408; G11C 29/70; G11C 29/82
USPC ......................................... 365/185.09, 185.18
See application file for complete search history.

(56) References Cited

U.S. PATENT DOCUMENTS

| | | | |
|---|---|---|---|
| 5,898,637 A | 4/1999 | Lakhani et al. | |
| 6,078,543 A | 6/2000 | Kim | |
| 6,392,945 B2 * | 5/2002 | Sato | ............................. 365/214 |
| 6,798,703 B2 | 9/2004 | Lee | |
| 7,482,644 B2 * | 1/2009 | Eggers et al. | ................. 257/208 |

* cited by examiner

*Primary Examiner* — Allison P Bernstein
(74) *Attorney, Agent, or Firm* — Hall Estill Attorneys at Law

(57) ABSTRACT

A fault tolerant control line configuration useful in a variety of solid state memories such as but not limited to a flash memory. In accordance with some embodiments, an apparatus includes a plurality of memory cells, and a fault tolerant control line. The control line has an elongated first conductive path connected to each of the plurality of memory cells. An elongated second conductive path is disposed in a parallel, spaced apart relation to the first conductive path. A plurality of conductive support members are interposed between the first and second conductive paths to support the second conductive path above the first conductive path.

20 Claims, 6 Drawing Sheets

US 9,105,361 B2

FAULT TOLERANT CONTROL LINE CONFIGURATION

SUMMARY

Various embodiments of the present disclosure are generally directed to a fault tolerant control line configuration useful in a variety of solid state memories such as flash memory arrays.

In accordance with some embodiments, an apparatus includes a plurality of memory cells adjacent a fault tolerant control line. The control line has an elongated first conductive path connected to each of the plurality of memory cells. An elongated second conductive path is disposed in a parallel, spaced apart relation to the first conductive path. A plurality of conductive support members is interposed between the first and second conductive paths to support the second conductive path above the first conductive path.

These and other features which may characterize various embodiments can be understood in view of the following detailed discussion and the accompanying drawings.

DETAILED DESCRIPTION

Figure 1:
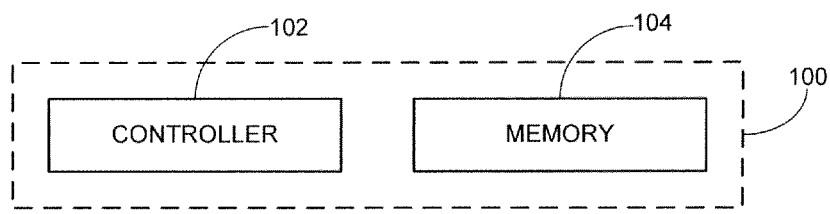
FIG. 1 provides a functional block representation of an exemplary data storage device arranged to communicate with a host device in accordance with some embodiments.

The present disclosure generally relates to a fault tolerant control line configuration for a memory, such as but not limited to a flash memory array of a data storage device.

A wide variety of data storage memories are known in the art. Some memories take the form of solid-state memory cells arrayed on a semiconductor substrate. Solid-state memory cells may store data in the form of accumulated electrical charge, selectively oriented magnetic domains, phase change states, ion/hole migration, etc.

Solid-state memory cells can be volatile or non-volatile. Exemplary solid-state memory cell constructions include, but are not limited to, static random access memory (SRAM), dynamic random access memory (DRAM), non-volatile random access memory (NVRAM), electrically erasable programmable read only memory (EEPROM), flash memory, spin-torque transfer random access memory (STRAM), magnetic random access memory (MRAM) resistive random access memory (RRAM) and phase change random access memory (PCRAM or PRAM).

Solid-state memory cells are programmed to a selected state during a write operation, and the programmed state may be subsequently read during a read operation. A write operation may include the application of one or more write currents to the cell to change the programmed state. A read operation may include the application of a read current to the cell to sense the programmed state. Some types of memory cells, such as flash memory cells, may require an erasure operation prior to writing new data to the cells. An erasure operation "resets" the cells to an initial default programmed state.

Access to the memory cells during such read, write and erasure operations can be provided using various control lines which respectively interconnect the memory cells along each row or column of an array. The control lines can include bit lines, word lines, source lines, enable lines, select lines, match lines, etc. The control lines are usually formed as a layer of conductive material which laterally extends above or below the respective row or column of memory cells. Driver and sense circuits can be selectively interconnected to the appropriate control lines to carry out the desired access operation on a group of cells.

The control lines in each set are closely spaced together and extend in parallel across the memory array. A variety of interconnection schemes can be employed to connect the control lines to the memory cells. A cross-point array generally provides two sets of control lines (bit and source lines), with the bit lines usually arranged above the memory cells and the source lines usually arranged below the cells. The bit lines extend in parallel fashion in a first direction, and the source lines extend in parallel fashion in a second direction orthogonal to the first direction.

Each memory cell in the cross-point array is connected to a different pair of the bit and source lines at each cross-point, or intersection, of the lines. Cross-point arrays are suitable for use with memory cells that use a total of two connection terminals, such as unidirectional memory cells (e.g., PRAM, etc.).

Another common control line interconnection scheme uses three control lines per memory cell, with bit and source lines connected to opposing terminals of each cell and a word line connected to a gate structure of a switching device of each cell, such as in the case of certain types of STRAM and RRAM cells. Another interconnection scheme connects each of the memory cells in a column with a first type of control line, such as a bit line, and each of the memory cells in a row with a second type of control line, such as a word line. This latter scheme is suitable for use in DRAM and flash memory arrays.

Regardless of the interconnection scheme, the associated control lines can be subject to control line faults. A control line fault can be characterized as a failure condition in which a control line experiences a partial or complete interruption in continuity. Control line faults can arise due to a number of different factors, such as from manufacturing defects encountered during fabrication of the semiconductor memory.

While commercially available memory devices are often subjected to extensive manufacturing screening testing to locate manufacturing faults, latent defects can escape the screening process and be manifested later during field use. Control line faults can also be induced subsequent to manufacturing due to static electrical discharges, handling damage, thermal expansion cycles, etc. Depending on the location and extent of a particular control line fault, relatively large sections of a memory may become unusable, and existing data stored to the array may not be recoverable.

A continuing trend in the industry is to reduce the size (e.g., F factor dimensions) of individual memory cells to promote increased data storage densities. This brings with it a corresponding reduction in the sizes and spacing of individual control lines, which further increases both the likelihood and severity of control line faults.

Accordingly, various embodiments of the present disclosure are generally directed to a fault tolerant control line configuration suitable for use with a variety of memory cell constructions and control line interconnection schemes. As explained below, a fault tolerant control line is provided which generally includes an elongated first conductive path connected to each of a plurality of memory cells. An elongated second conductive path is disposed in a parallel, spaced apart relation to the first conductive path. A plurality of conductive support members is interposed between the first and second conductive paths to support the second conductive path above the first conductive path.

In some embodiments, at least three of the conductive support members are disposed between the first and second conductive paths, with one support member at each end of the first and second conductive paths and one in a medial region of the first and second conductive paths. This provides a variety of alternate parallel paths for control signals to be provided to the memory cells, even in the presence of multiple control line faults. In further embodiments, multiple driver circuits are employed to concurrently apply the control signals along the control line to the memory cells.

These and other features of various embodiments can be understood beginning with a review of FIG. 1, which provides a simplified block diagram of a data storage device 100. The device 100 includes a controller 102 and a memory module 104.

The controller 102 provides top level control for the device, and may be realized as a hardware based or programmable processor. The memory module 104 provides a main data store for the device 100 and constitutes a solid-state memory.

For purposes of providing an illustrative example, the device 100 is contemplated as anon-volatile data storage device that utilizes flash memory cells in the memory module 104 to provide a main memory for a host device (not shown). The present disclosure can be readily adapted for any number of different types of volatile and non-volatile semi-conductor memory cells for the memory module 104, including but not limited to DRAM, SRAM, RRAM, STRAM, MRAM, XRAM and PRAM.

Figure 2:
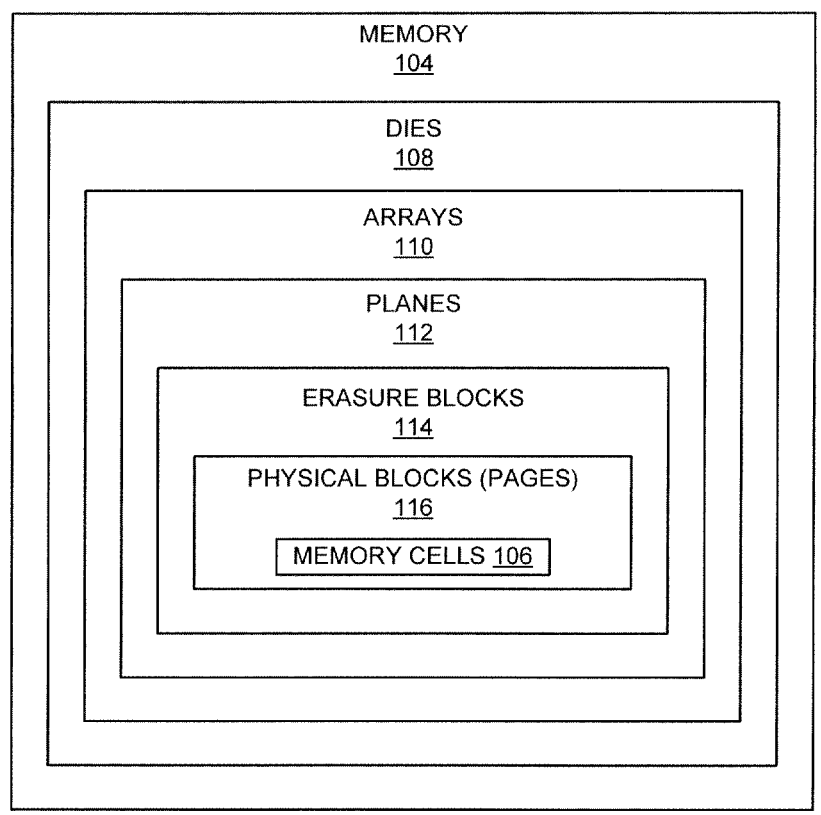
FIG. 2 shows a hierarchy of addressable memory levels in the memory of FIG. 1.

FIG. 2 shows a hierarchical structure for the flash memory module 104 (hereinafter "memory") having addressable elements from a highest order (the memory 104 itself) to lowest order (individual flash memory cells 106). Other structures and arrangements can be used.

The memory 104 takes the form of one or more semiconductor dies 108. Each die may be realized as an encapsulated integrated circuit (IC) having at least one physical, self-contained semiconductor wafer. The dies 108 may be affixed to a printed circuit board (PCB) to provide the requisite interconnections. Each die incorporates one or more flash arrays 110, which may be realized as a physical layout of the flash memory cells 106 arranged into rows and columns, along with the associated driver, decoder and sense circuitry to carry out access operations (e.g., read/write/erase) upon the arrayed cells.

The flash arrays 110 are divided into planes 112 which are configured such that a given access operation can be carried out concurrently to the cells in each plane. For example, an array 110 with eight planes 112 can support eight concurrent data access operations, one on each plane.

The cells 106 in each plane 112 are arranged into individual erasure blocks 114, which represent the smallest number of memory cells that can be erased at a given time. Each erasure block 114 may in turn be formed from a number of pages (rows) 116 of the flash memory cells 106. Generally, an entire page worth of data is written or read at a time.

Figure 3:
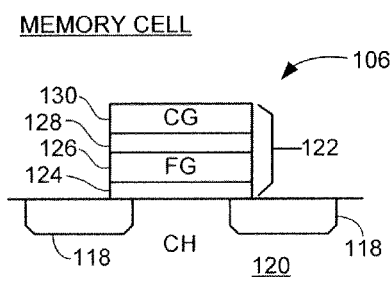
FIG. 3 shows a flash memory cell construction that can be used in the device of FIG. 1.

FIG. 3 illustrates an exemplary flash memory cell 106 from FIG. 2. Localized doped regions 118 are formed in a semiconductor substrate 120. A gate structure 122 spans each pair of adjacent doped regions 118 and includes a lower insulative barrier layer 124, a floating gate (FG) 126, an upper insulative barrier layer 128 and a control gate (CG) 130. The flash cell 106 takes a form similar to an nMOSFET (n-channel metal oxide semiconductor field effect transistor) with the doped regions 118 corresponding to source and drain terminals and the control gate 130 providing a gate terminal.

Data are stored to the cell 106 in relation to an amount of accumulated charge on the floating gate 126. A write operation biases the respective doped regions 118 and the control gate 130 to migrate charge from a channel region (CH) across the lower barrier 124 to the floating gate 126. The presence of the accumulated charge on the floating gate tends to place the channel in a non-conductive state from source to drain. The channel can be transitioned to a conductive state through application of sufficient voltage to the control gate 130. Data are stored in relation to the amount of accumulated charge on the floating gate 128.

A greater amount of accumulated charge will generally require a larger control gate voltage to render the cell conductive from source to drain. During a read operation, a sequence of voltages is successively applied to the control gate 130 to identify the smallest voltage magnitude in the applied sequence that places the channel in a conductive state. The programmed state of the cell 106 is determined in relation to this read voltage magnitude. An erasure operation reverses the polarities of the source and drain regions 118 and the control gate 130 to migrate the accumulated charge from the floating gate 126 back to the channel to reset (erase) the memory cell.

The cell 106 can be configured as a single-level cell (SLC) or a multi-level cell (MLC). An SLC stores a single bit; a normal convention is to assign the logical bit value of 1 to an erased cell (substantially no accumulated charge) and a logical bit value of 0 to a programmed cell (presence of accumulated charge). An MLC stores multiple bits, such as two bits. Generally, n bits can be stored using $2^n$ storage states.

Figure 4:
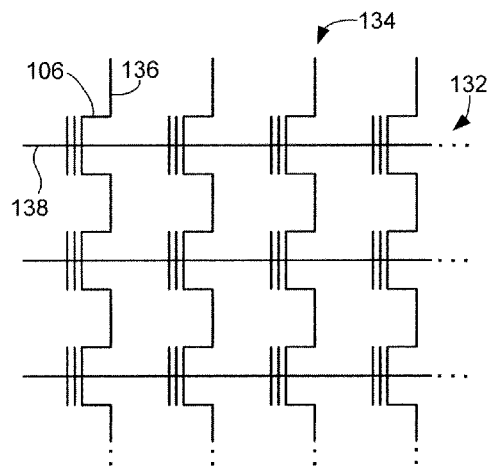
FIG. 4 is a schematic depiction of a portion of a flash memory array using the cells of FIG. 3.

FIG. 4 shows memory cells such as 106 in FIG. 3 arranged into rows 132 and columns 134. Each column 134 is connected to a bit line 136, and each row 132 is connected to a word line (WL) 138. The columns 134 are formed by providing adjacent ones of the flash memory cells 106 in a NAND configuration by placing a gate structure 122 between each adjacent pair of the doped regions 118 in the semiconductor substrate 120. The memory cells are arranged in a line with the drain of one cell connected to the source of the next. The word lines 138 extend across the width of the array and interconnect the control gates 130 of the memory cells in each row 132.

Figure 5:
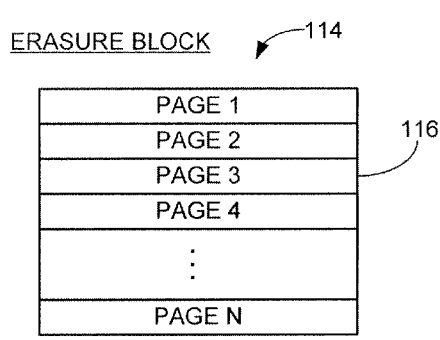
FIG. 5 illustrates an exemplary format for an erasure block of the memory array.

An exemplary format for a selected erasure block 114 is depicted in FIG. 5. The block 114 includes N pages 116 (see FIG. 2), with each page corresponding to a row 132 in FIG. 4. The erasure blocks 114 may be combined into multi-block garbage collection units (GCUs), which are allocated and erased as a unit during a garbage collection operation. In an SLC environment, each row 132 of memory cells 106 stores a single page of data. In an MLC each row 132 of memory cells 106 stores multiple pages of data, with each cell storing multiple bits, one bit per page.

Figure 6:
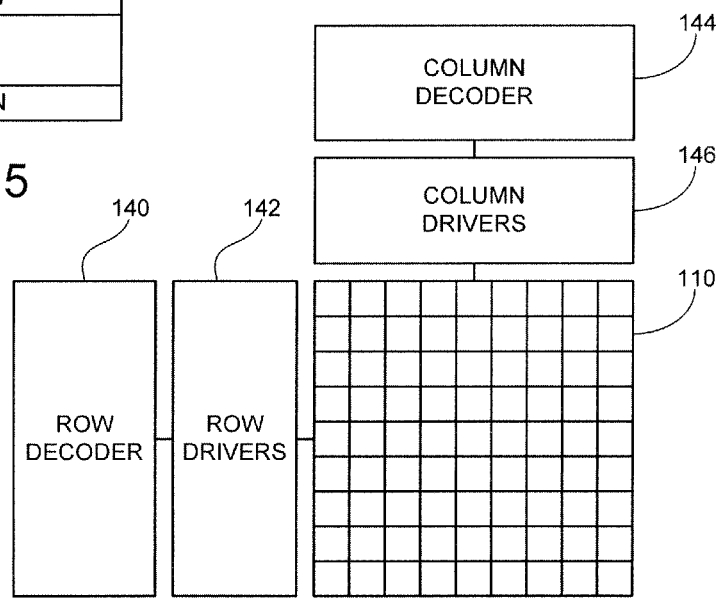
FIG. 6 illustrates row and column decoder and driver circuitry for the array of FIG. 4.

FIG. 6 illustrates a grouping of memory cells 106, such as a selected flash array 110 from FIG. 2, with dedicated control circuitry to facilitate read, write and erasure (collectively, "access") operations upon the memory cells 106. The control circuitry can include a row decoder 140, one or more row drivers 142, a column decoder 144 and one or more column drivers 146. The row and column decoders 140, 144 provide addressing and other selection inputs to the row and column drivers 142, 146. The row and column drivers apply the requisite control signals (e.g., voltages) to the respective bit and word lines 136, 138 to access a selected group of cells.

Figure 7:
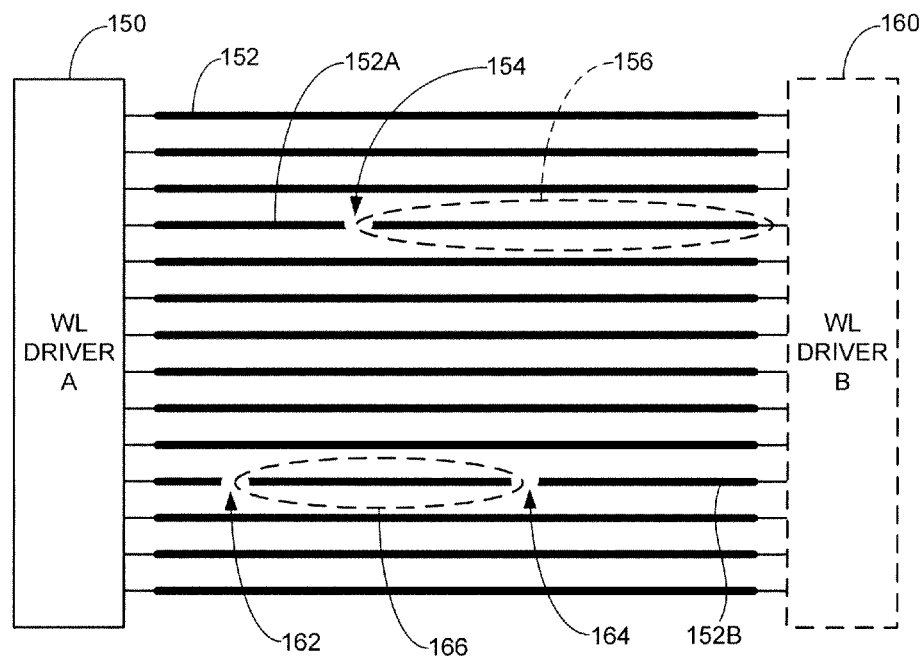
FIG. 7 illustrates word line drivers from FIG. 6 useful in compensating for fault conditions associated with word lines of the array in accordance with some embodiments.

FIG. 7 illustrates a word line (WL) driver 150 (denoted as "Driver A") of the type which can be incorporated into the row driver circuitry 142 of FIG. 6. The WL driver 150 and drives a number of word lines 152 configured in accordance with some embodiments. As with the word lines 138 discussed above, each of the word lines 152 interconnects the control gates 130 of the memory cells 106 along each row 132. In one embodiment, each row constitutes 8192×8=65,536 memory cells, so that each page represents approximately 8 kilobytes (KB) of data. Other page sizes and corresponding numbers of memory cells in each row can be used.

A control line fault in a selected word line 152A is represented at 154. The control line fault 154 constitutes a break in the continuity of the word line 152A. It has been found that control line faults can induce a significant number of bit errors and, in some cases, cause a driver failure and complete loss of page data.

During a read operation, the row and column drivers 142, 146 (FIG. 6) sequentially impress different non-zero voltages to the word lines along each row and the bit lines along each column to sense the programmed data. Using the single driver 150, all of the data stored in the memory cells encircled at 156 would generally be unrecoverable as a result of the fault 154, since the fault 154 prevents voltage supplied by the WL driver 150 from reaching the downstream cells in the encircled portion 156.

Control line faults such as depicted at 154 can arise due to a variety of factors. In some cases, it has been found that microscopic particulate contamination during device manufacturing can prevent cobalt silicidation reactions between the deposited Co metal of the control gate of a cell and the silicon used to form the word line. The blocking of the silicidation reactions forms a small zone of un-silicidated material in the word line.

In the short term, this zone can present a higher electrical resistance to the line which may or may not be detected during manufacturing testing. Over time, temperature cycling and handling can induce a grown defect that ultimately results in a break in continuity, such as via an open circuit or an excessively high electrical resistance sufficient to prevent proper operation of the driver circuitry. Other types of defects can arise as well.

In accordance with some embodiments, defects such as the control line fault 154 are compensated by the use of a second word line (WL) driver 160 (denoted "Driver B") in conjunction with the WL driver 150 ("Driver A"). The respective WL drivers 150, 160 are disposed at opposing ends of the word lines 152.

In some embodiments, both WL drivers are concurrently operated to apply a selected voltage to each associated word line. This can provide faster and more accurate data recovery performance. The concurrent use of both WL drivers 150, 160 to supply word line voltages to word lines 152 not exhibiting a control line fault can provide enhanced performance. By activating both drivers, the maximum distance along the associated word line 152 is approximately one-half the entire length of the word line. Thus, the effects of parasitic resistance and capacitance as a function of distance may be reduced, allowing more reliable performance and faster access response. Moreover, the data may be immediately recovered even in the presence of a fault such as at 154 along the line without the need to perform a follow-up data recovery operation.

In other embodiments, only a single one of the WL drivers, such as WL driver 150, is activated and the second WL driver, such as WL driver 160, is activated in response to a readback detection fault. In this latter approach, once a readback error is detected during a read operation on word line 152A using the first WL driver 150, the second WL driver 160 can be activated for that word line 152A, potentially enabling the recovery of the data in the encircled region 156. Error correction techniques can be used to recover the missing data bits (if any) proximate to the fault location. Subsequent corrective actions can be taken such as by reallocating the data stored along word line 152A to a different location, and deallocating and marking as defective the cells along word line 152A. Alternatively, the individual cells 106 affected by the fault 154 can be deallocated and the remaining memory cells along the word line 152 can continue to be used for the storage of data.

Continuing with FIG. 7, another word line 152B is shown to exhibit two faults 162, 164. While less common than a single fault, it has been observed that some word lines can occasionally exhibit two (or more) faults over time. In this latter case, use of the two WL drivers 150, 160 can be used to retrieve data from the respective ends of the word line 152B. However, this scheme, by itself, may not generally enable recovery of the data encircled at 166 between the two control line faults 162, 164. Depending on the relative spacing of the faults 162, 164, successful recovery of the page data stored along word line 152B may or may not be achievable.

Figure 8:
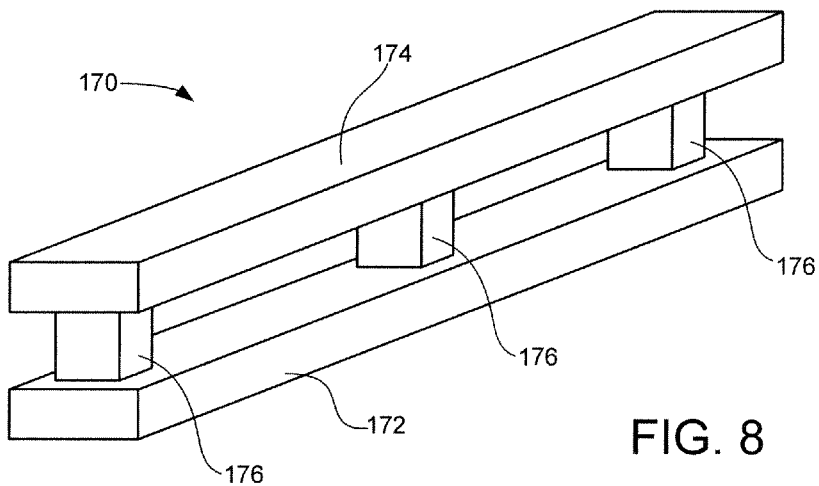
FIG. 8 isometrically depicts a fault tolerant control line in accordance with some embodiments.

Accordingly, the present disclosure provides a control line configuration adapted to enhance fault tolerance to multiple faults, including two or more faults. FIG. 8 illustrates an exemplary fault tolerant control line 170 in accordance with some embodiments. It will be appreciated that the control line 170 is not drawn to scale or necessarily depicted with an accurate aspect ratio. While suitable for the word line applications discussed in FIG. 7, the control line 170 can be readily adapted for use as any number of different types of control lines, including bit lines, source lines, match lines, select lines, driver lines, enable lines, etc.

The control line 170 includes a lower, elongated first conductive path 172 and an upper, elongated second conductive path 174. The respective paths 172, 174 are continuously extending, electrically conductive members and may be formed of the same material or different materials. Conductive support members 176 are disposed between the paths 172, 174 in periodic, spaced-apart relation to interconnect the same. The support members 176 may take the form of vias (plated-through holes, PTHs) or other conductive structures. The support members 176 may be formed of the same material as the paths 172, 174, or each of the elements 172, 174 and 176 may be formed of a different conductive material.

Figure 9:
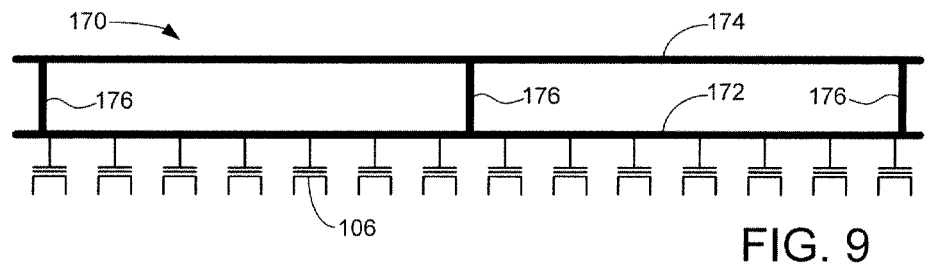
FIG. 9 schematically illustrates the fault tolerant control line of FIG. 8.

FIG. 9 depicts the control line 170 of FIG. 8 in a word line application as set forth by FIG. 7. A number of flash memory cells 106 are depicted as being interconnected to the first path 172. In practice, many more memory cells will be interconnected than that shown along each control line. As discussed above in FIG. 4, each of the memory cells 106 will be interconnected to a separate bit line 136 (not shown in FIG. 9).

Figure 10:
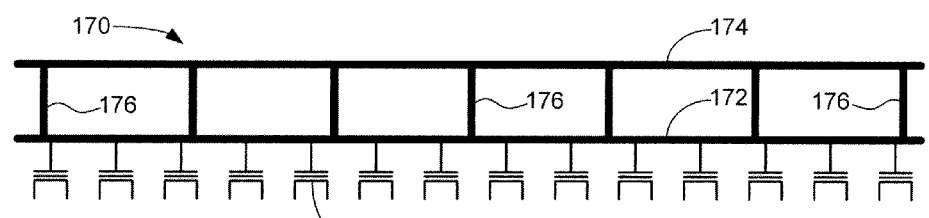
FIG. 10 is another schematic illustration of the fault tolerant control line in accordance with some embodiments.

While FIGS. 8 and 9 depict the use of three (3) interconnecting support members 176, this is merely illustrative and not limiting. FIG. 10 shows the use of seven (7) interconnecting support members. Any suitable number of members 176 may be used.

Figure 11:
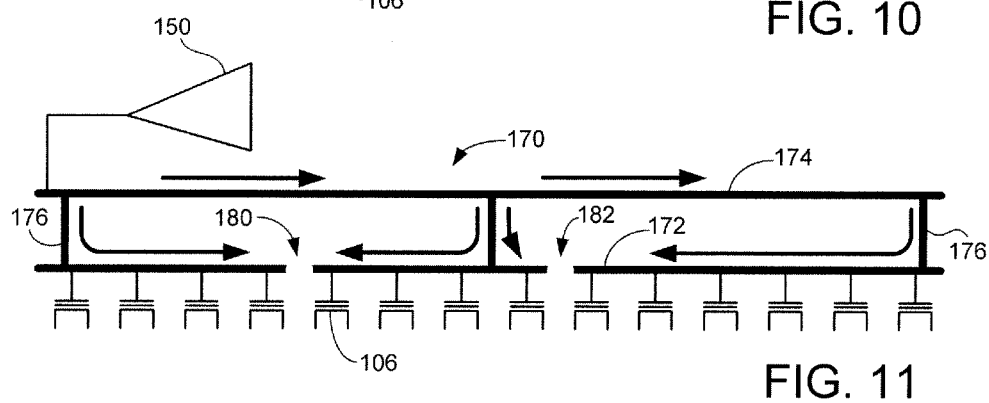
FIG. 11 represents operation of the fault tolerant control line using one of the drivers of FIG. 7.

FIG. 11 depicts the configuration of FIG. 9 in the presence of two control line faults 180, 182. The various voltage paths (indicated by arrows) illustrate how that, even in the presence of multiple faults, voltage can be supplied to substantially all of the memory cells 106 along the control line 170 from the single WL driver 150.

Figure 12:
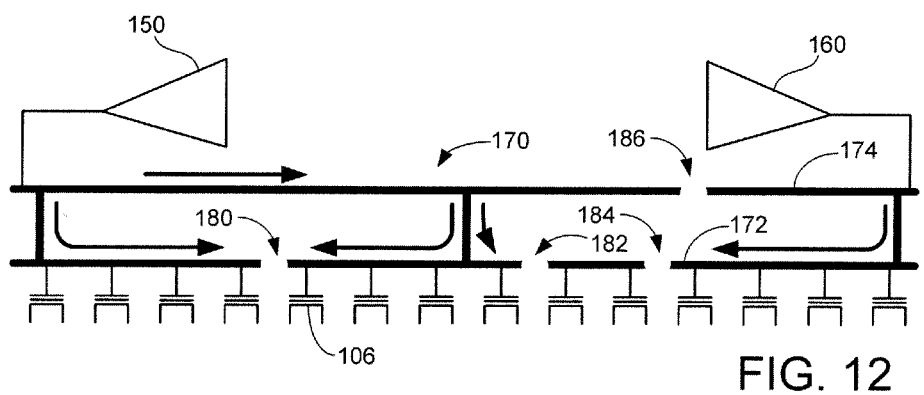
FIG. 12 depicts operation of the fault tolerant control line using both of the drivers of FIG. 7.

FIG. 12 illustrates the configuration of FIG. 9 with the addition of the second WL driver 160 and two additional faults 184, 186. Even in the event of the four (4) faults 180-186, substantially all of the memory cells 106 can be provisioned with control gate voltages sufficient to enable successful recovery of the page data stored to the memory cells along the control line 170. FIG. 12 further demonstrates that the control line 170 is fault tolerant with regard to faults occurring in the upper conductive path 174 (e.g., fault 186) as well as faults occurring in the lower conductive path 172 (e.g., faults 180-184).

The interconnecting support members 176 provide sufficient alternative paths for the applied voltage to reach the various memory cells 106. It is contemplated that the configuration of FIG. 9, in which three (3) support members 176 are used (one at each end and one in a medial position) will be sufficient in many cases to protect against at least two faults along the line 170. The provision of additional support members 176, as in FIG. 10, and/or the use of the additional driver 160, as in FIG. 12, can further enhance the fault tolerance of the control line 170.

Figure 13:
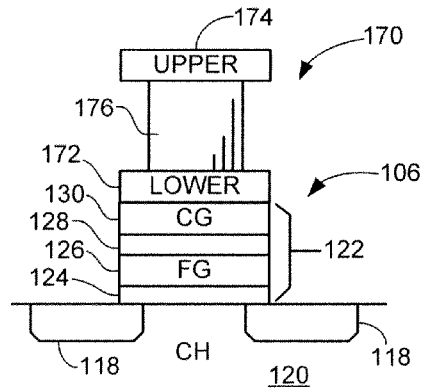
FIG. 13 provides an elevational semiconductor stack representation of the fault tolerant control line in conjunction with a selected flash memory cell.

FIG. 13 provides an end view elevational depiction of a selected flash memory cell 106 in conjunction with the fault tolerant control line 170. The relative dimensions of the various elements will vary as required for a given application. The control line 170 and the memory cell 106 form a vertical semiconductor stack with the lower conductive path 172 connected to the control gate 130 and the upper conductive path 174 supported over the lower path 172 by way of the support members 176. For reference, the support member 176 is depicted in FIG. 13 as an annular plated-through hole (PTH). Although not shown, non-conductive material may be used to surround the memory cell and the control line 170.

Figure 14:
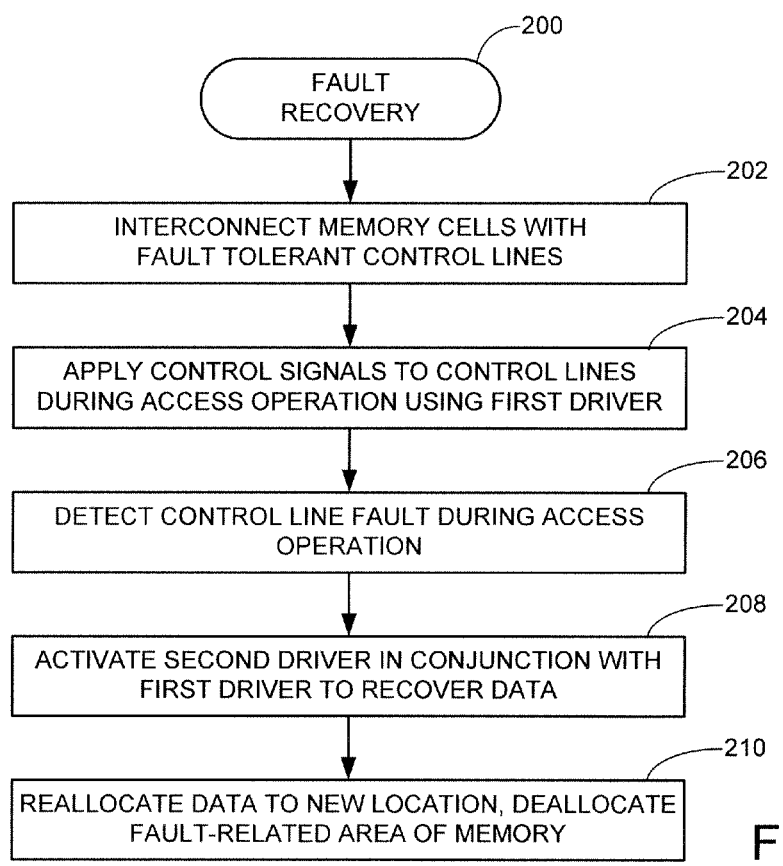
FIG. 14 is a flow chart depicting steps that can be carried out in accordance with some embodiments of the present disclosure.

FIG. 14 provides a flow chart for a FAULT RECOVERY routine 200 illustrative of steps carried out in accordance with some embodiments. For illustration purposes, the routine 200 will be discussed in the context of the use of the control lines 170 as word lines in FIG. 7, although such is not limiting. The routine 200 will contemplate the use of a single driver (e.g., driver 150 in FIG. 7) during normal operation and the switching in of a second driver (e.g., driver 160) in response to a detected fault condition. It will be appreciated, however, that in an alternative embodiment, both drivers 150, 160 may be continuously used during normal operation.

At step 202, flash memory cells 106 in an array are interconnected using the fault tolerant control lines 170. As noted above, this will occur during device fabrication and will result in the lower path 172 of each control line interconnecting the control gates 130 of the memory cells 106 along each row. Other control lines can be interconnected at this time as well, including the bit lines 136 depicted in FIG. 4. These other control lines can take a conventional configuration or can also have the configuration of the control lines 170 as desired. The control lines 170 can also be used for other purposes, such as the provision of thermal preconditioning currents to a selected set of cells.

During subsequent device operation in step 204, control signals are applied to the respective control lines to access data at a selected location in the memory array. The access operation can take a variety of forms such as a read operation, a write operation or an erasure operation. The access operation is carried out using a first driver, such as the WL driver 150 in FIG. 7 to apply control gate voltages to the memory cells 106 along a selected row in the array.

A fault is detected during the access operation at step 206. The detection of the fault may occur as a result of detected characteristics of other control circuitry associated with the array, such as out of tolerance voltage or current values, timeout values, excessive error rates, etc. In some cases, the row/column decoders or row/column drivers of FIG. 6 may operate to detect the control line fault condition. A variety of corrective actions is known in the art and can be taken to eliminate other causes for the error and allow the system to determine the fault is associated with a control line discontinuity.

At step 208, a second driver, such as the WL driver 160, can be activated in conjunction with the first driver 150 to recover the data. This can be carried out as discussed above in FIGS. 7, 11-12. Once the data are recovered, the data stored in the associated memory location can be reallocated to a new location within the memory, and the location in the memory associated with the fault can be deallocated.

Figure 15:
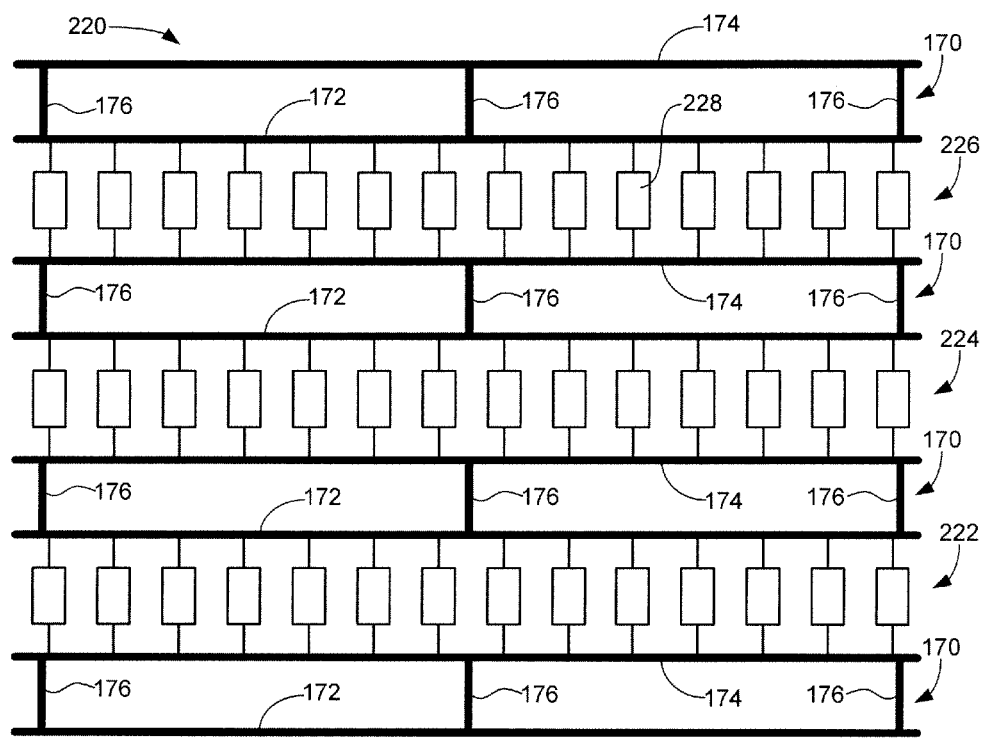
FIG. 15 illustrates the fault tolerant control line in a three-dimensional (3D) stacked memory array application.

While a single layer of memory cells has been exemplified herein, the fault tolerant control lines are also suitable for use in three dimensional (3D) or "stacked" memory arrays where multiple layers of memory cells are arranged on a semiconductor substrate, one above the next, in a vertical direction. Once such arrangement is shown at 220 in FIG. 15. Three (3) layers 222, 224 and 226 of memory cells 228 are interconnected by four (4) layers of the fault tolerant control lines 170. The memory cells 228 are respective interconnected to different ones of the lower and upper conductive paths 172, 174 as shown.

Figure 16:
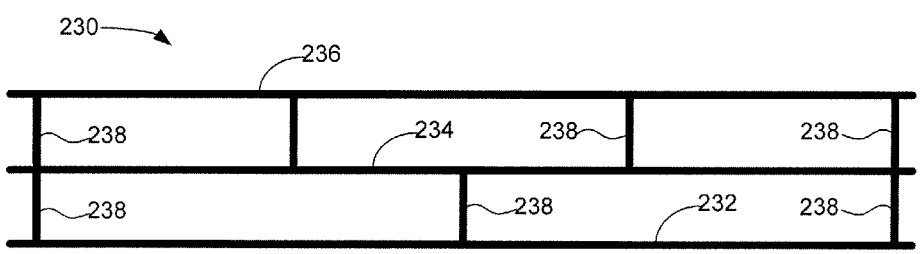
FIG. 16 depicts an alternative configuration for the fault tolerant control line.

Fault tolerant control lines with more than two conductive paths are also envisioned. FIG. 16 illustrates a fault tolerant control line 230 with three (3) elongated conductive paths 232, 234 and 236. The respective paths are interconnected by support members 238, which as before can take the form of plated-through holes (PTHs) or other interconnecting support structures. The spacing and placement of the support members can be vertically aligned or offset, as desired. Any plural number of the conductive paths can be incorporated depending on the requirements of a given application.

It will be appreciated that the various embodiments disclosed herein can provide a number of benefits. The exemplary fault tolerant control lines provide a space efficient configuration that can be utilized in existing applications and can meet currently specified control line width and spacing constraints. In many cases, the control line provides continued full access to all memory cells along the line, apart from those immediately proximate a fault, allowing continued use of the row of memory cells and the deallocation of the affected memory cells in the presence of one or more faults.

Depending on the conductive materials used for the respective conductive paths, additional fabrication costs associated with the fault tolerant control lines may be offset by reduced complexity and/or loss of data storage capacity that would otherwise occur with the use of redundant areas and additional compensation circuits as often employed in existing solutions. The exemplary control lines may tend to increase the ability to recover existing data from a memory in the event of a fault, as compared to other solutions. The use of dual drivers further provides faster performance and faster fault recovery.

For purposes of the appended claims, reference to positions such as "upper" and "lower," "vertical" and "horizontal," "above" and "below," "rows" and columns" and the like will be understood in a relative sense without any particular reference to absolute positions.

It is to be understood that even though numerous characteristics and advantages of various embodiments of the present disclosure have been set forth in the foregoing description, together with details of the structure and function of various embodiments, this detailed description is illustrative only, and changes may be made in detail, especially in matters of structure and arrangements of parts within the principles of the present disclosure to the full extent indicated by the broad general meaning of the terms in which the appended claims are expressed.

What is claimed is:

1. An apparatus comprising:
a three dimensional (3D) memory structure comprising a first plurality of memory cells disposed in a first layer of the 3D memory structure and a second plurality of memory cells disposed in a second layer of the 3D memory structure above the first layer; and
a fault tolerant control line comprising an elongated first conductive path connected to each of the first plurality of memory cells, an elongated second conductive path in parallel, spaced-apart relation to the first conductive path and connected to each of the second plurality of memory cells, and a plurality of spaced-apart conductive support members between the first and second conductive paths which support the second conductive path above the first conductive path.

2. The apparatus of claim 1, in which the plurality of conductive support members are characterized as first, second and third support members, the first and second support members disposed at opposing ends of the first and second conductive paths, and the third support member disposed at a medial position between said opposing ends.

3. The apparatus of claim 1, further comprising a driver circuit connected to the fault tolerant control line adapted to concurrently supply a control signal to the plurality of memory cells in parallel along the first and second conductive paths and the plurality of conductive support members.

4. The apparatus of claim 3, in which the driver circuit is connected to a selected one of the first or second elongated conductive paths at a first end thereof, and in which the apparatus further comprises a second driver circuit connected to a selected one of the first or second elongated conductive paths at an opposing second end thereof.

5. The apparatus of claim 4, further comprising a detection circuit which, responsive to a detected control line fault in the fault tolerant control line, activates the second driver circuit to concurrently apply the control signal during operation of the first driver circuit.

6. The apparatus of claim 1, in which the first plurality of memory cells, the second plurality of memory cells and the fault tolerant control line form a vertical semiconductor stack with the first conductive path comprising a lower path and the second conductive path comprising an upper path vertically aligned over the lower path.

7. The apparatus of claim 1, in which the first plurality of memory cells and the second plurality of memory cells comprise flash memory cells, and the fault tolerant control line connects to a respective terminal of each of the flash memory cells.

8. The apparatus of claim 1, in which the plurality of support members are vertically arranged plated-through holes so that the first conductive path is disposed between the memory cells and the second conductive path.

9. The apparatus of claim 1, wherein the elongated first conductive path is formed of a first material and the elongated second conductive path is formed of a different second material.

10. The apparatus of claim 1, further comprising an elongated third conductive path extending in spaced-apart parallel fashion to the first and second conductive paths, and a second plurality of spaced-apart conductive support members disposed between the second and third conductive paths to support the third conductive path above the second conductive path.

11. An apparatus comprising:
a plurality of memory cells arranged into rows and columns;
a plurality of fault tolerant control lines in alignment with and extending adjacent to a selected one of said rows or columns, each fault tolerant control line interconnecting the memory cells in the associated row or column and comprising an elongated lower conductive path, an elongated upper conductive path in parallel, spaced apart relation to the lower conductive path, and a plurality of conductive support members interposed between the upper and lower conductive paths to support the upper conductive path above the lower conductive path, the plurality of conductive support members characterized as first, second and third support members, the first and second support members disposed at opposing ends of the upper and lower conductive paths, the third support member disposed at a medial position between said opposing ends; and
a driver circuit adapted to apply control signals to the plurality of fault tolerant control lines so that each control signal concurrently passes in parallel along the associated upper and lower conductive paths in each control line.

12. The apparatus of claim 11, wherein each fault tolerant control line further comprises an elongated intermediate conductive path extending in spaced-apart parallel fashion between the upper and lower conductive paths, and a second plurality of spaced-apart conductive support members offset from the plurality of conductive support members.

13. The apparatus of claim 11, in which the driver circuit is connected to a selected one of the upper or lower elongated conductive paths at a first end thereof, and in which the apparatus further comprises a second driver circuit connected to a selected one of the first or second elongated conductive paths at an opposing second end thereof.

14. The apparatus of claim 13, further comprising a detection circuit which, responsive to a detected control line fault in a selected one of the plurality of fault tolerant control lines, activates the second driver circuit to concurrently apply a control signal to the selected one of the plurality of fault tolerant control lines during operation of the driver circuit.

15. The apparatus of claim 11, in which the memory cells along each row or column and the associated fault tolerant control line form a vertical semiconductor stack with the lower conductive path connected to an upper layer of each of the plurality of memory cells therealong and the upper conductive path is vertically aligned over the lower layer.

16. The apparatus of claim 11, in which the plurality of memory cells comprise flash memory cells, and the fault tolerant control line is a word line which interconnects a control gate of each of the flash memory cells along a selected row in a memory device.

17. The apparatus of claim 11, in which the plurality of support members are vertically arranged plated-through holes so that the lower conductive path is disposed between the memory cells and the upper conductive path.

18. An apparatus comprising:
a plurality of memory cells interconnected with a fault tolerant control line comprising an elongated lower conductive path, an elongated upper conductive path in parallel, spaced apart relation to the lower conductive path, and a plurality of conductive support members interposed between the upper and lower conductive paths to support the upper conductive path above the lower conductive path; and
a driver circuit interconnected to the fault tolerant control line configured to apply a control signal to the fault tolerant control line that concurrently passes in parallel along the upper and lower conductive paths from a first end of the fault tolerant control line to the plurality of memory cells, the driver circuit comprising a first driver connected to the first end of the fault tolerant control line and a second driver connected to an opposing second end of the fault tolerant control line.

19. The apparatus of claim 18, wherein the control signal is generated and applied by the first driver while the second driver is in an inactive state.

20. The apparatus of claim 19, further comprising a detector circuit which detects a control line fault associated with the fault tolerant control line responsive to the application of the control signal to the fault tolerant control line by the first driver, the detector circuit configured to transition the second driver from the inactive state to an active state responsive to the detected control line fault, the second driver applying a second control signal to the fault tolerant control line that passes in parallel along the upper and lower conductive paths during continued application of the control signal to the fault tolerant control line by the first driver.

* * * * *